United States Patent
Dorfi et al.

(10) Patent No.: US 9,245,070 B2
(45) Date of Patent: Jan. 26, 2016

(54) SYSTEM AND METHOD FOR DETERMINING STATISTICAL DISTRIBUTION OF A ROLLING TIRE BOUNDARY

(71) Applicant: Bridgestone Americas Tire Operations, LLC, Nashville, TN (US)

(72) Inventors: Hans Dorfi, Akron, OH (US); Thomas R. Branca, Bradford, MA (US)

(73) Assignee: BRIDGESTONE AMERICAS TIRE OPERATIONS, LLC, Nashville, TN (US)

( * ) Notice: Subject to any disclaimer, the term of this patent is extended or adjusted under 35 U.S.C. 154(b) by 0 days.

(21) Appl. No.: 14/391,776

(22) PCT Filed: Mar. 25, 2013

(86) PCT No.: PCT/US2013/033661
§ 371 (c)(1),
(2) Date: Oct. 10, 2014

(87) PCT Pub. No.: WO2013/154816
PCT Pub. Date: Oct. 17, 2013

(65) Prior Publication Data
US 2015/0073757 A1 Mar. 12, 2015

Related U.S. Application Data

(60) Provisional application No. 61/622,300, filed on Apr. 10, 2012.

(51) Int. Cl.
*G06F 17/50* (2006.01)
*G06T 19/20* (2011.01)
(52) U.S. Cl.
CPC ............ *G06F 17/5018* (2013.01); *G06T 19/20* (2013.01); *G06T 2219/2012* (2013.01)
(58) Field of Classification Search
None
See application file for complete search history.

(56) References Cited

U.S. PATENT DOCUMENTS

| 3,702,009 A | 10/1972 | Baldwin, Jr. |
| 4,727,501 A | 2/1988 | Parker et al. |

(Continued)

FOREIGN PATENT DOCUMENTS

| EP | 0953834 A2 | 11/1999 |
| JP | 2000321053 A | 11/2000 |

(Continued)

OTHER PUBLICATIONS

Danielson et al., "Computational Strategies for Tire Modeling and Analysis", Computers & Structures, vol. 61, Issue 4, Nov. 1996, pp. 673-693.*

(Continued)

*Primary Examiner* — Omar Fernandez Rivas
*Assistant Examiner* — Herng-Der Day
(74) *Attorney, Agent, or Firm* — Shaun J. Fox; Bryan Jaketic

(57) ABSTRACT

A system and method for modeling a distribution of a tire footprint boundary (202) include inputting a finite element model of a tire rolling against a road surface described by discrete road surface coordinates into a finite element analysis system (100). A finite element analysis simulation of tire model rolling against the road surface for a plurality of time increments is performed. A plurality of tire footprint boundary (202) data are generated, each having road surface coordinates on which a footprint boundary (202) overlaps during a unique one of a second plurality of time increments. The number of second plurality of time increments during which the footprint boundary (202) overlaps the each of the discrete road surface coordinates is determined for each of the time increments of the simulation. For each coordinate, the number of the second plurality of time increments may be associated with a color scale or grayscale (510).

15 Claims, 7 Drawing Sheets

(56) References Cited

U.S. PATENT DOCUMENTS

| | | |
|---|---|---|
| 5,587,898 A | 12/1996 | Palm |
| 5,750,890 A | 5/1998 | Fricke et al. |
| 6,036,349 A | 3/2000 | Gombar |
| 6,192,745 B1 | 2/2001 | Tang et al. |
| 6,443,199 B1 | 9/2002 | Scarpitti et al. |
| 6,514,366 B1 | 2/2003 | Xie |
| 6,725,168 B2 | 4/2004 | Shiraishi |
| 6,781,702 B2 | 8/2004 | Rosakis |
| 7,203,267 B2 | 4/2007 | DeMan et al. |
| 7,363,805 B2 | 4/2008 | Jayakumar et al. |
| 7,373,287 B2 | 5/2008 | Asper |
| 7,434,456 B2 | 10/2008 | Shiraishi |
| 7,533,010 B2 | 5/2009 | Sundkvist et al. |
| 7,778,809 B2 | 8/2010 | Miyashita et al. |
| 7,843,456 B2 | 11/2010 | Xu et al. |
| 7,912,683 B2 | 3/2011 | Miyashita et al. |
| 2004/0172224 A1 | 9/2004 | Sadagopan et al. |
| 2006/0031046 A1 | 2/2006 | Asper |
| 2009/0281773 A1 | 11/2009 | Coe et al. |
| 2009/0292515 A1 | 11/2009 | Fevrier et al. |
| 2010/0018628 A1 | 1/2010 | Ueyoko |
| 2010/0186865 A1 | 7/2010 | Froger et al. |
| 2011/0077918 A1 | 3/2011 | Mutlu et al. |

FOREIGN PATENT DOCUMENTS

| | | |
|---|---|---|
| JP | 2005153686 A | 6/2005 |
| JP | 2007083925 A | 4/2007 |
| JP | 2009020123 A | 1/2009 |
| KR | 20090050092 A | 5/2009 |

OTHER PUBLICATIONS

Hwang, Yun Koo, International Search Report with Written Opinion from PCT/US2013/033661, 10 pp. (Jul. 31, 2013).

International Preliminary Report on Patentability; Corresponding PCT Application No. PCT/US2013/033661; Authorized Officer Mineko Mohri; Jan. 14, 2014.

\* cited by examiner

|  | k | k+1 | k+2 |
|---|---|---|---|
| i+2 | 3/4 | 2/4 | 0/4 |
| i+1 | 2/4 | 4/4 | 0/4 |
| i | 0/4 | 4/4 | 3/4 |

FIG. 4

SYSTEM AND METHOD FOR DETERMINING STATISTICAL DISTRIBUTION OF A ROLLING TIRE BOUNDARY

FIELD OF INVENTION

This disclosure relates to computer modeling of rolling tires, including through finite element analysis.

BACKGROUND

The computational resources required to perform finite element analyses of tires are significant. Maximizing the amount of information extracted from the data generated in any particular analysis can increase the benefit to the engineer or researcher performing the analysis, and would do so at a lower cost than would be incurred by performing additional analyses of a tire model. A particularly costly type of analysis in terms of the computational resources required is that of a rolling tire on a road surface. Thus, maximizing the information obtained from the data concerning, for example, the interaction of the tire with the road surface is beneficial.

SUMMARY

A system and method for modeling a distribution of a tire footprint boundary include inputting a finite element model of a tire rolling against a road surface described by discrete road surface coordinates into a finite element analysis system. A finite element analysis simulation of tire model rolling against the road surface for a plurality of time increments is performed. A plurality of tire footprint boundary data are generated, each having road surface coordinates on which a footprint boundary overlaps during a unique one of a second plurality of time increments. The number of second plurality of time increments during which the footprint boundary overlaps the each of the discrete road surface coordinates is determined for each of time increments of the simulation. For each coordinate, the number of the second plurality of time increments may be associated with a color scale or grayscale.

BRIEF DESCRIPTION OF THE DRAWINGS

In the accompanying drawings, structures and methods are illustrated that, together with the detailed description provided below, describe exemplary embodiments of systems and methods for determining statistical distributions of rolling tire footprint boundaries. One of ordinary skill in the art will appreciate that a single component may be designed as multiple components or that multiple components may be designed as a single component.

Further, in the accompanying drawings and description that follow, like parts are indicated throughout the drawings and written description with the same reference numerals, respectively. The figures are not drawn to scale and the proportions of certain parts have been exaggerated for convenience of illustration.

FIG. 4 illustrates a graph showing time increments during which boundary overlapped with coordinates in region 300 divided by the total number of time increments.

DETAILED DESCRIPTION

Figure 1:
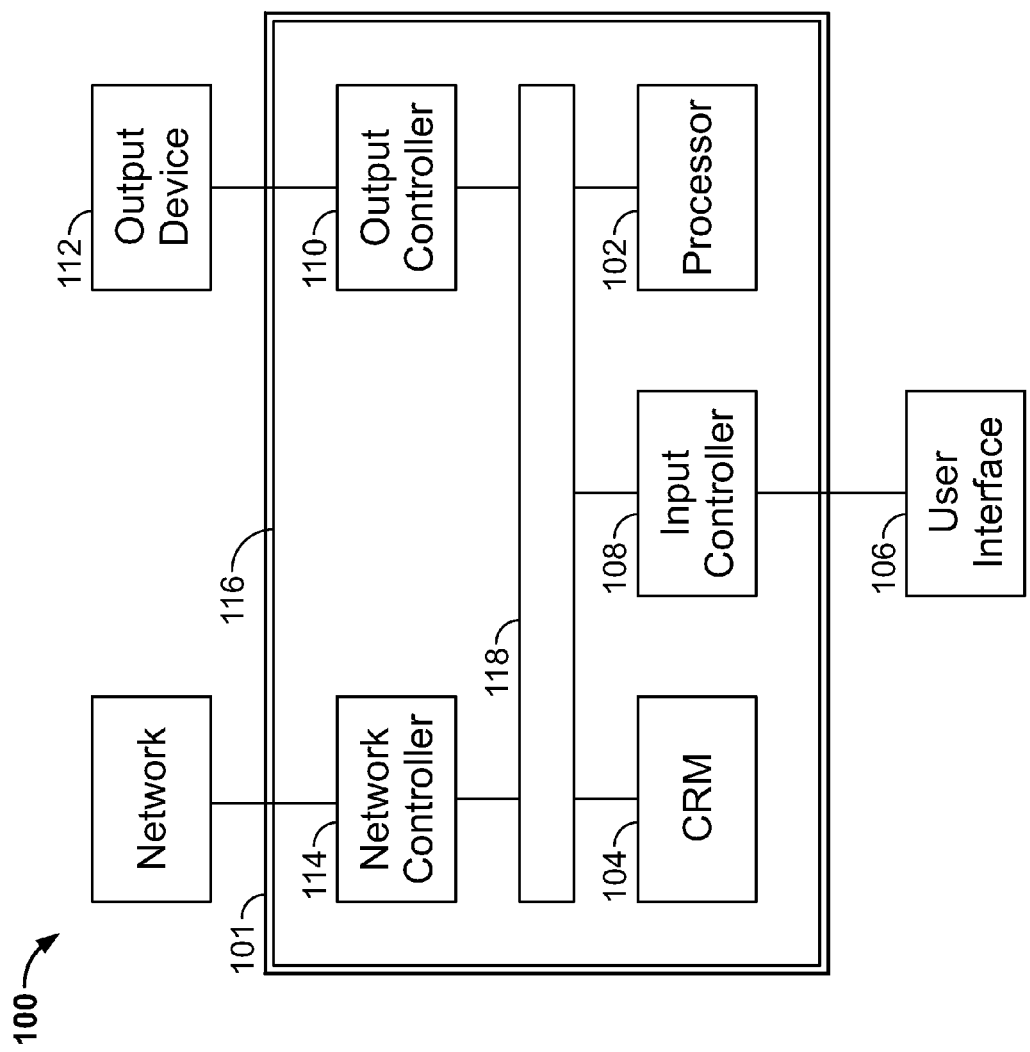
FIG. 1 illustrates a block diagram of an exemplary finite element analysis (FEA) processing system 100.

FIG. 1 illustrates a block diagram of an exemplary finite element analysis (FEA) processing system 100. FEA processing system 100 may include a computing device 101 housing a processor 102 and computer readable medium 104. A user interface 106, such as a keyboard, mouse or other such device is connected to an input controller 108, allowing the user to interact with FEA system 100, including with processor 102 and computer readable medium 104. Output controller 110 may receive information from input controller 108, processor 102 and/or computer readable medium 104 for presentation to the user through output device 112, which may take the form of a video monitor or printer, for example. Computer readable medium 104 may take the form of a hard disk drive, solid state hard drive or read only memory ("RAM"), for example, and may supply information to any of the components of FEA processing system 100. A network controller 114 allows FEA system 100 to communicate with a network, such as the internet or company intranet. One or more of user input controller 108, output controller 110 and network controller may be integrated into processor 102. The components of FEA system 100, such as processor 102 and computer readable medium 104, may be secured to a motherboard 116, which provides connections among the various components, for example through bus 118.

In a preferred embodiment, FEA system 100 performs the methods disclosed herein through use of an FEA software package installed upon the computer readable medium 104 having instructions that can be executed by processor 102. When executed by processor 102, the FEA software package is configured to receive an FEA model of a tire and perform an FEA analysis of the tire model. An FEA model may incorporate a variety of aspects of a tire, such as tread design, tire size, tire shape, material properties of the tread and underlying structures, such as belt plies, and inflation level. While tire models are exemplary, the teachings herein may be applied to a model of any type of deformable structure rolling over a surface, such as a rubber disk rolling on a flat plane. As used herein, the term "tread" refers to that portion of the tire that comes into contact with the road under normal load. The FEA model may be introduced to the FEA system 100 by the user through user interface 106, or by selection and retrieval of a previously composed model stored on computer readable medium 104 or on a storage device accessible though the network. Processor 102 generates results of the FEA analysis in the form of data that is written to and stored on the computer readable medium 104. The data generated by the FEA analysis may, for example, be displayed on output device 112, or may be processed further.

Figure 2:
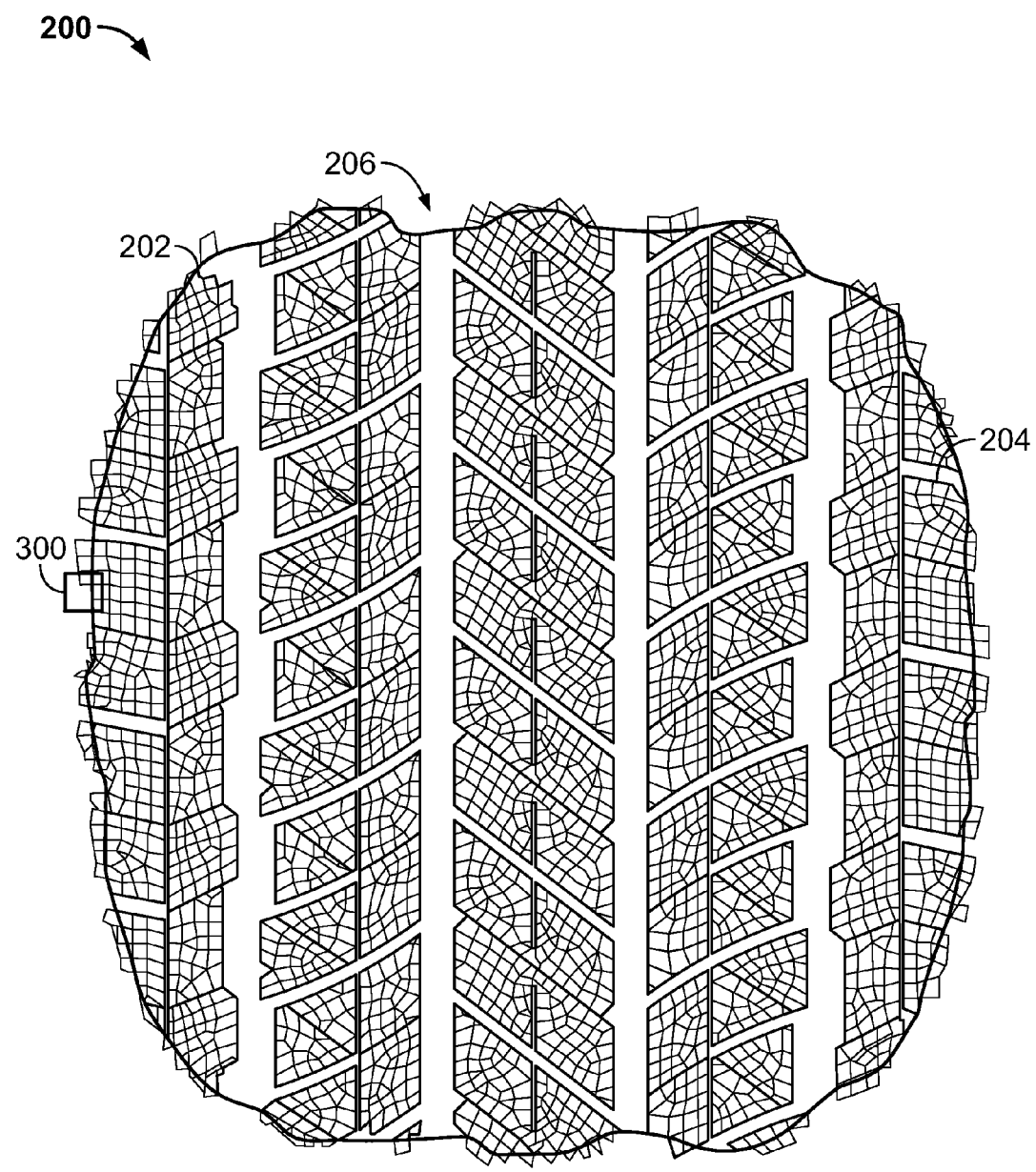
FIG. 2 illustrates a footprint 200 of a rolling tire against and road surface generated by FEA system 100.

FIG. 2 illustrates a single footprint 200 generated by FEA system 100 of a rolling tire against and road surface. Boundary 202 surrounds and defines the outer perimeter of the footprint 200. Boundary 202 may be determined by connecting the outermost nodes 204 of the FEA mesh 206 within footprint 200 by a straight line. Other methods of determining the location of boundary 202 may also be used, for example FEA system 100 may perform linear and/or non-linear curve fitting based on footprint data across a range of adjustable model parameters such as tire load. Such methods may smooth boundary 202, resulting in a boundary 202 more representative of the boundary that would be found in a real-world application of the modeled tire. One such method is disclosed in U.S. Pat. No. 7,373,287, incorporated herein by reference. FEA system 100 may generate boundary 202 data for each incremental time step of a given FEA simulation and store the data on computer readable medium 104. Boundary 202 data may take the form of a set of discrete two-dimensional planar Cartesian coordinates on the simulated road surface in a reference frame moving such that the relative velocity of between the frame and the spindle is zero.

For nonplanar road surface, three dimensional Cartesian coordinates, or non-Cartesian coordinates may be used to describe coordinates on the road surface. The simulated road surface may be described completely by a set of discrete coordinates, such that any point on the road surface may be described by one of the discrete coordinates. For example, the simulated road surface may be divided into N rows along the X-coordinate, and M columns along the Y coordinate, where N and M are positive integers. Each discrete coordinate in the road surface plane may be uniquely described by a two numbers, the first corresponding to a particular row, from 1 to N, and the second corresponding to a particular column, from 1 to M.

FIGS. 3A through 3D illustrate close-up views of region 300 shown in FIG. 2 taken at different points in time during the FEA simulation of the rolling tire. Region 300 is made up of a grid having 3 rows and 3 columns of squares representing discrete coordinates in the plane of the road surface. The rows are the i, i+1 and i+2 rows along the X-coordinate, for some positive integer i where i, i+1 and i+2 are all less than N. The columns are the k, k+1 and k+2 columns along the Y-coordinate, for some positive integer k, where k, k+1 and k+2 are all less than M. The illustrated squares have a length and width corresponding to the length along the X-coordinate and width along the Y-coordinate of the simulated road surface, divided by N and M, respectively. In a preferred embodiment, N and M are chosen so that the length and width of the discrete M times N coordinates are about 0.5 millimeters, while the average distance between nodes of the FEA mesh selected for the tire model is about between 1-10 millimeters, or about between 2 times and 20 times greater than the average length and/or width of one of the discrete M times N coordinates. The mesh used for an FEA analysis may be configured by a user. While increasingly granular resolutions may produce a more accurate FEA analysis, the need for such resolution must typically be balanced at least by limitations with respect to the availability of processing resources and the demands of the tire model (e.g., models of larger tires will require correspondingly more nodal points when using a particular sized mesh than smaller tires). In one exemplary embodiment, a default FEA mesh having adjacent nodes separated by between about 1 mm to 9 mm may be used. In another exemplary embodiment, adjacent nodes may be separated by about 7 mm. In yet another exemplary embodiment, nodes of an FEA mesh may be separated by about 5 mm.

Figure 3B:
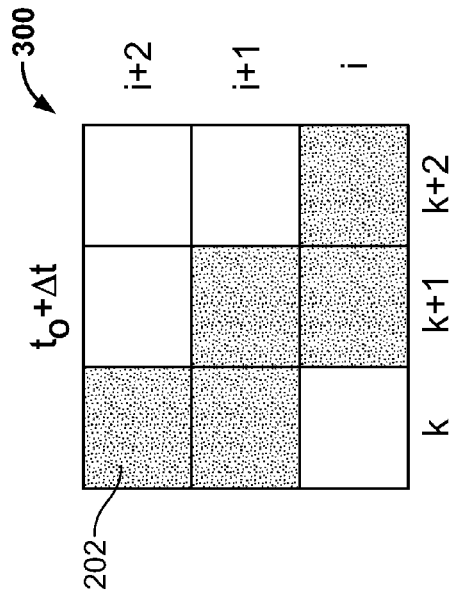
FIGS. 3A-3D illustrate close-up views of region 300 shown in FIG. 2 taken at different time increments.
Figure 3D:
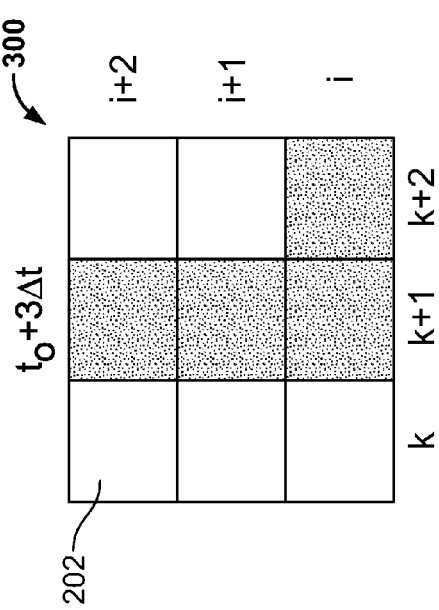
Figure 3A:
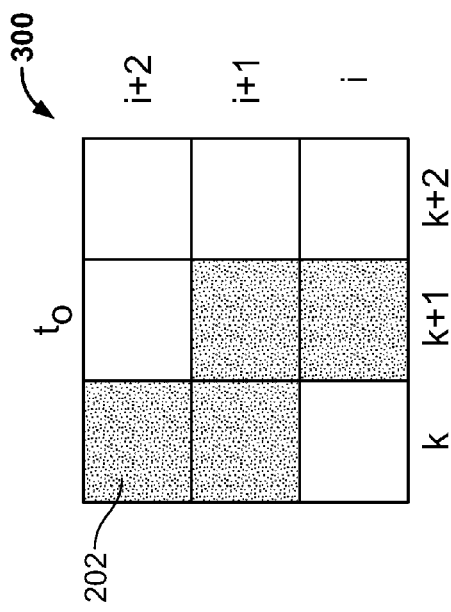
Figure 3C:
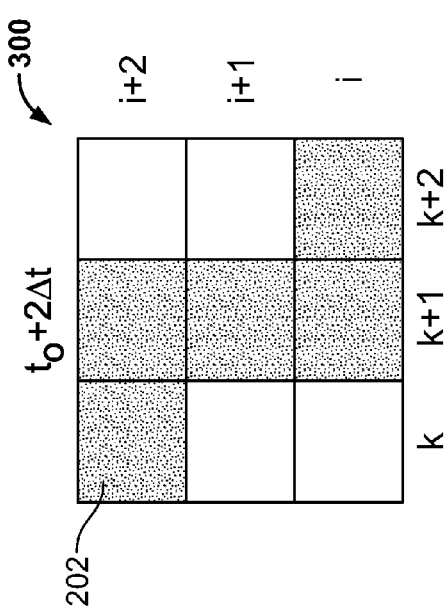

With further reference to FIGS. 3A through 3D, regions 300 shown here are taken at sequential points in time during the FEA simulation. The FEA simulation iteratively calculates the dynamical and/or mechanical properties of the tire model and its interaction with the road surface in increments starting with initial conditions at time t=0, and ending at some time T. The selection of time t=0 as the starting point is arbitrary, and any initial time may be chosen as the starting point for implementing the teachings described herein. The duration of the time increments are $\Delta t$, so that for some positive integer K, T is equal to K multiplied by $\Delta t$. FIG. 3A shows region 300 at time $t_0$, where $t_0$ is greater than 0 and less than T. FIGS. 3B, 3C and 3D show region 300 at the sequential time coordinates $t_0+\Delta t$, $t_0+2\Delta t$ and $t_0+3\Delta t$, respectively. The darkened squares correspond to coordinates with which boundary 202 overlaps at the corresponding time, whereas the light squares correspond to coordinates with which boundary 202 does not overlap at the corresponding time increment. As can be seen in FIGS. 3A to 3D, boundary 202 variation across the pixels as the FEA simulation proceeds forward in time from $t=t_0$ to $t=t_0+3\Delta t$.

As seen in FIG. 3A, boundary 202 overlaps with squares at coordinates (i+2, k), (i+1, k), (i+1, k+1), and (i, k+1). In FIG. 3B, boundary 202 overlaps with squares at coordinates (i+2, k), (i+1, k), (i+1, k+1), (i, k+1) and (i, k+2). In FIG. 3C, boundary 202 overlaps with squares at coordinates (i+2, k), (i+2, k+1), (i+1, k+1), (i, k+1) and (i, k+2). In FIG. 3D, boundary 202 overlaps with squares at coordinates (i+2, k+1), (i+1, k+1), (i, k+1) and (i, k+2). Thus, over the four samples of region 300, boundary 202 has overlapped with the squares at coordinates (i+1, k+1) and (i, k+1) four times, the squares at coordinates (i+2, k+1), (i+1, k) and (i, k+2) three times, the square at coordinate (i+2, k) two times and the squares at coordinates (i+2, k+2), (i+1, k+2) and (i, k) zero times.

Figure 4:
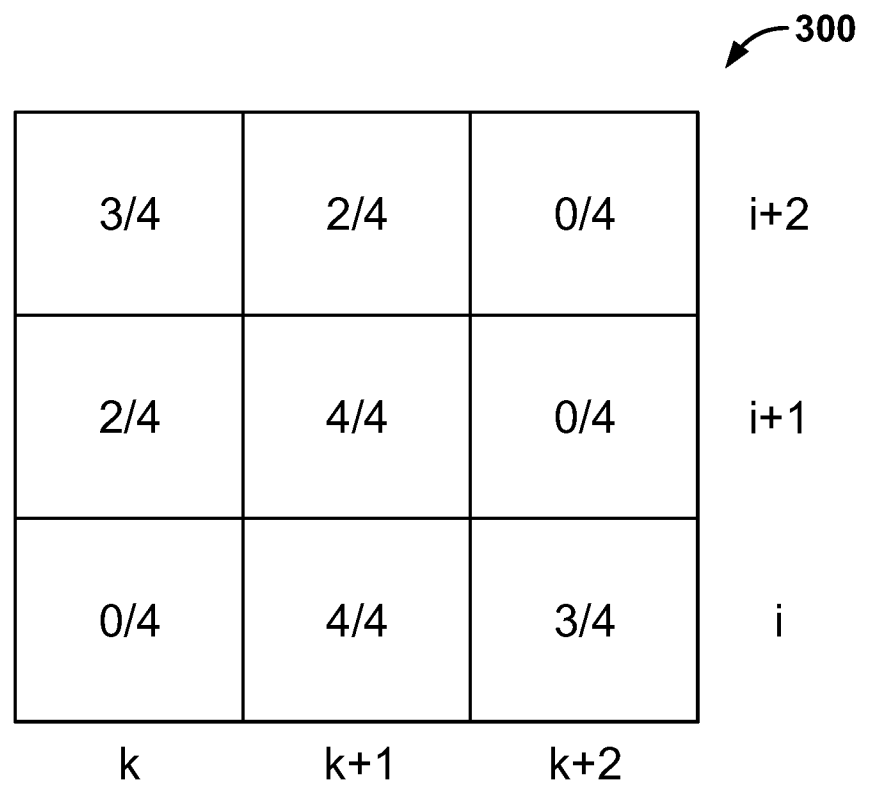

According to the present disclosure, there are multiple ways to assign a numerical value corresponding to the occurrence of boundary overlap at particular coordinates of the simulated road surface. In one example of obtaining a numerical boundary overlap value, an aggregate number of overlapping time increments is calculated, similar to a histogram. In another example, the boundary overlap value may be given as a density measured as the boundary overlap occurrences per unit time. FIG. 4 illustrates a graph representing the number of time increments during which boundary overlapped with the squares in region 300 over the time increments represented in FIGS. 3A-3D, divided by the total number of time increments. As shown in FIG. 4, boundary 202 has overlapped with the squares at coordinates (i+1, k+1) and (i, k+1) four times during the four possible time increments, the squares at coordinates (i+2, k+1), (i+1, k) and (i, k+2) three times during the four possible time increments, the square at coordinate (i+2, k) two times during the four possible time increments and the squares at coordinates (i+2, k+2), (i+1, k+2) and (i, k) zero times during the four possible time increments. During an actual FEA simulation, the number of time increments will typically be much larger than four, and may for example total in the hundreds. In one preferred embodiment the number of time increments will total between 20 and 800 increments. In yet other embodiments, the totals will range between 100-200 time increments. Typically, for any particular coordinate on the road surface, the total number of time increments during which the border overlaps the particular coordinate will be less than the total possible number of time increments over which the border may overlap the particular coordinate.

The determination of the number of time increments during which boundary 202 overlaps a particular coordinate as described with respect to FIGS. 3A through 3D may be extended to every discrete coordinate in the road surface, and for each time increment performed in the FEA of the model. The expression for the number of time increments during which boundary 202 overlaps a particular coordinate, Sum(x, y), may be given as follows:

$$\text{Sum}(x, y) = \sum_{j=0}^{j=(T/\Delta t)} O_j(x, y)$$

Where $O_j(x, y)$ is equal to 1 if the boundary overlaps with coordinate $(x, y)$ at time increment $j$ times $\Delta t$, and 0 if the boundary does not overlap with coordinate $(x, y)$ at time increment $j$ times $\Delta t$. In one preferred embodiment, the index $j$ runs from 0 to $(T/\Delta t)$. However, in alternative embodiments, $\text{Sum}(x, y)$ may be a sum taken over a different range of index variable $j$. For example, the index may have a lower bound greater than 0, which corresponds to the starting point of the FEA simulation. For example, the lower bound may be selected so that index spans only those time increments after which the tire model has achieved steady state motion. Likewise, the upper bound may be selected to be less than $(T/\Delta t)$, such that time increments during which the model has left a steady state are not included in $\text{Sum}(x,y)$. In other alternative embodiments, the sum may be taken over an index taken at different evenly spaced time increments, such as $(0, 2\Delta t, 4\Delta t, 6\Delta t, \ldots)$ or $(0, 3\Delta t, 6\Delta t, 9\Delta t, \ldots)$, up to a selected upper bound. In a preferred embodiment, the time increments over which $\text{Sum}(x,y)$ is performed are evenly spaced in order to prevent disproportionate weight to be given to any particular time span and the number of increments may represent a characteristic roll distance such as a integer multiple of tread pattern pitches.

In an embodiment where the road surface is planar having rows 1 to N and columns 1 to M, there will be M times N unique coordinates on which boundary 202 may overlap at each time increment. Where an FEA simulation runs from a time t=0 to T, there will be $(T/\Delta t)+1$ footprints for which FEA system 100 may determine the coordinates on which boundary 202 overlaps, including the initial conditions of the model at t=0. In a preferred embodiment, FEA system 100 determines the number of time increments for which boundary 202 overlaps each discrete coordinate in the road surface plane and records this data to computer readable medium 104.

Figure 5:
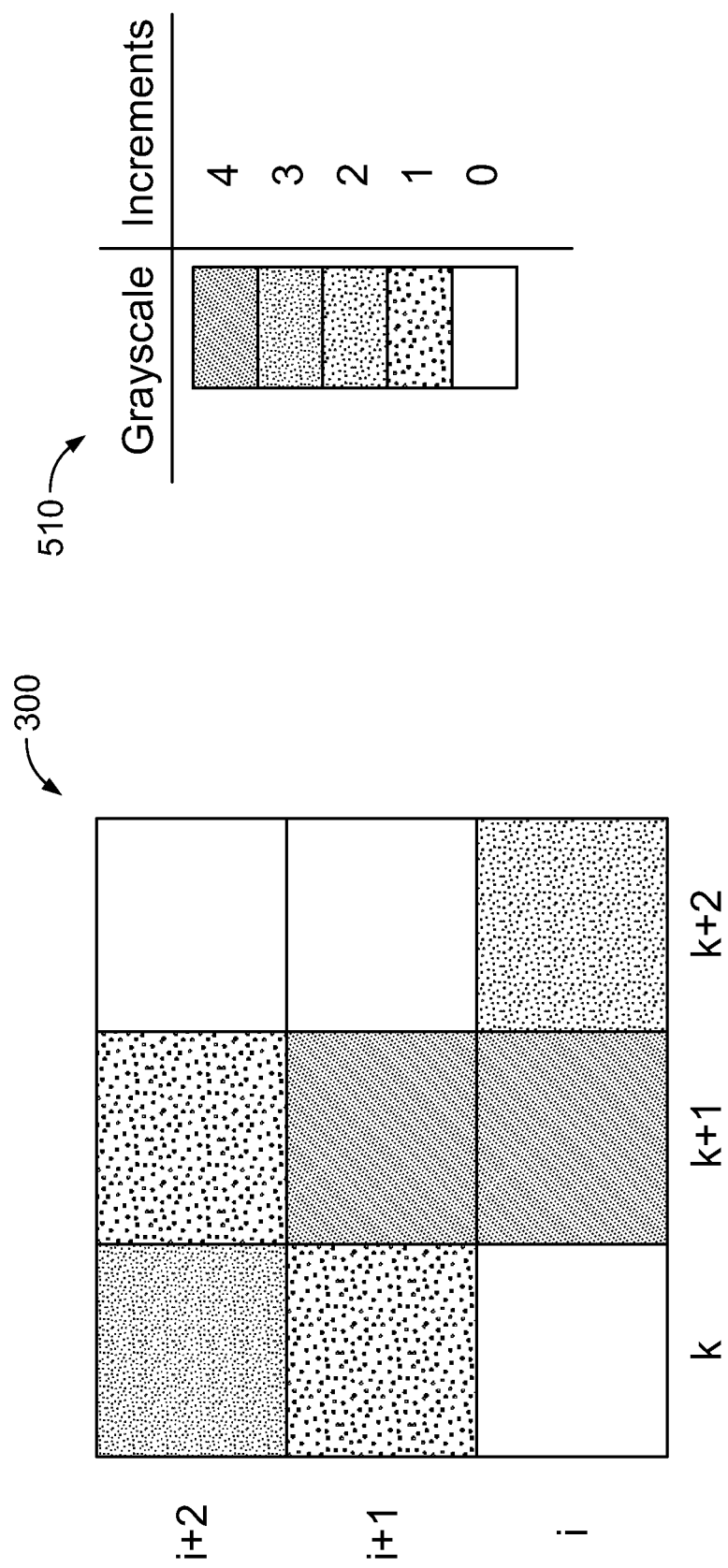
FIG. 5 illustrates the results shown in FIG. 4 in a grayscale plot 500.

FIG. 5 displays the results shown in FIG. 4 in a plot 500 that represents the number of instances of overlap of the tire boundary with the coordinates of region 300. The higher the number of overlaps, the darker the corresponding shades in grayscale 510. The grayscale 510 shading here is associated with the number of instances of overlap over the interval $t=t_0$ to $t=t_0+3\Delta t$. In an alternative embodiment, the grayscale 510 shading may correspond to the number of instances of overlap divided by the number of time increments over which the summation is performed, providing a frequency of overlap. The value of such a frequency will be proportional to $\text{Sum}(x, y)$ for any particular coordinate the value of $\text{Sum}(x,y)$ at any coordinate will be divided by the same value of the number of time intervals for each $(x,y)$ coordinate. In other aspects of the present teachings, the number of instances of overlap may be divided by a constant value such that the highest obtained value for the frequency is equal to 1.

Figure 6:
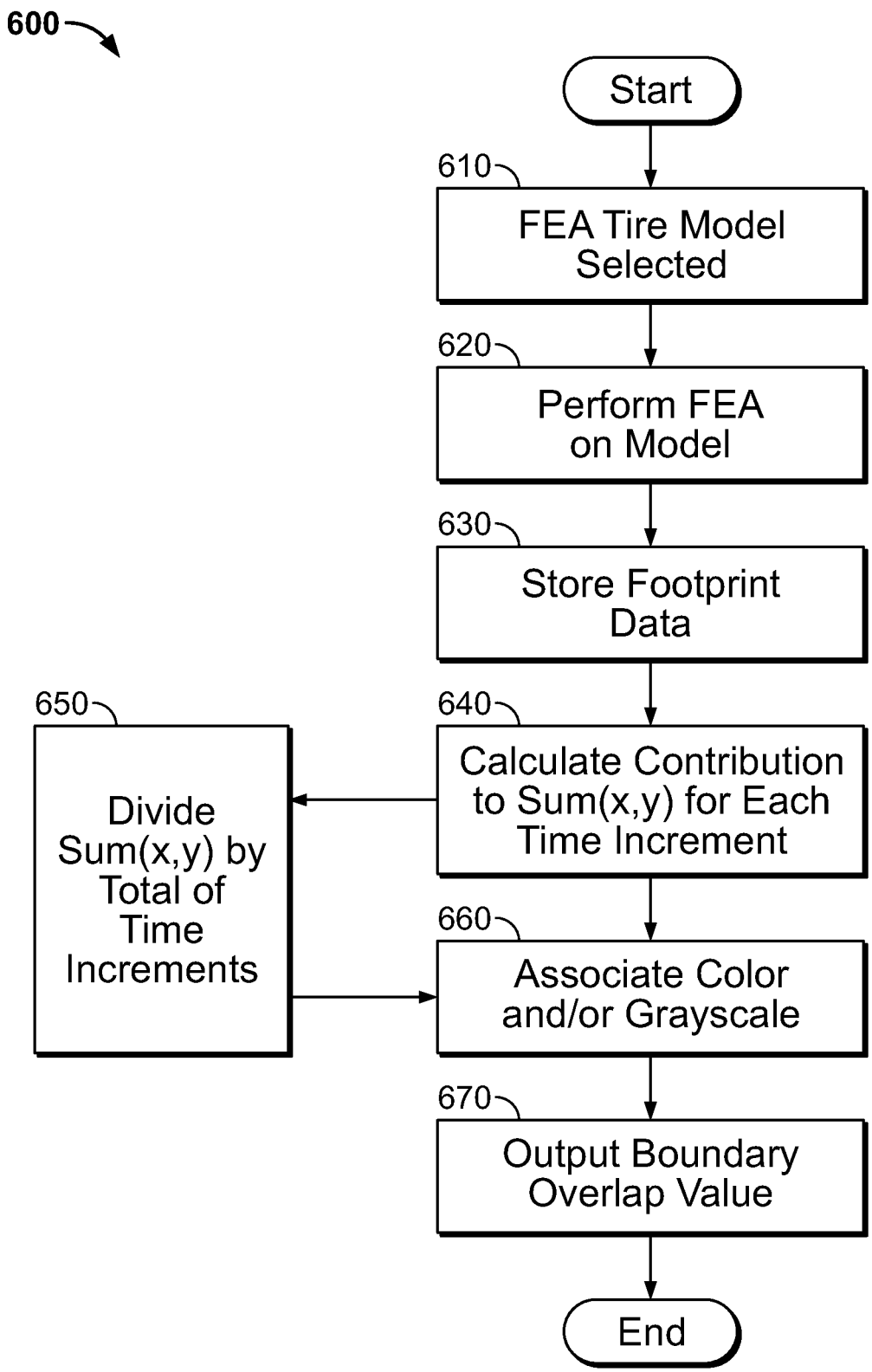
FIG. 6 illustrates an exemplary method 600 according to the present disclosure.

FIG. 6 illustrates an exemplary method 600 that may be performed by FEA system 100 to generate a plot of the frequency of boundary overlap at points on the simulated road surface and/or the sum total of time intervals during which boundary overlaps at points on the simulated road surface. At step 610, a finite element model of a tire is selected. Such a model may incorporate a variety of aspects of a tire, such as tread design, tire size and shape. The FEA model may be introduced to the FEA system 100 by the user's interaction with the FEA software package through user interface 106, or by selection and retrieval of a previously composed model stored on computer readable medium 104. At step 620, the FEA system 100 performs an FEA simulation on the model selected at step 610, for example through processor 102 executing the instructions contained within an FEA software package stored on computer readable medium 104. At step 630, footprint 200 data is stored by FEA system 100, for example in computer readable medium 104. As used herein, footprint 200 data need not be limited to only data concerning the footprint of a rolling tire simulation, but instead refers to data that includes data concerning footprint 200. In one preferred embodiment, the footprint data stored in step 630 includes at minimum the position of the footprint 200 boundaries for each incremental time step of the FEA simulation. Alternatively, footprint 200 data may include data in addition to that necessary to determine the boundary position of the tire footprint 200 at each incremental time step. For example, such data could include dynamical properties of the rolling tire, such as angular momentum or footprint contact forces. The footprint 200 data may be stored incrementally as the FEA simulation is being performed, for example after processor 102 completes its calculations of the instantaneous state of the modeled tire for each time increment. Alternatively, footprint 200 data may be extracted from a more comprehensive data set obtained from the FEA simulation after completion of simulation.

At step 640, FEA system 100 calculates, for each coordinate on the simulated road surface, the number of time increments during which the border overlaps with the particular coordinate, for example by processor 102 executing instructions to calculate the $\text{Sum}(x, y)$ given above for each coordinate in the simulated road surface. In practice, boundary 200 will be limited to a subset of the possible coordinates in the simulated road surface. As such, FEA system may limit the x and y coordinates over which it performs the summation $\text{Sum}(x, y)$ to only those coordinates identified by the user, or in another example only to those coordinates that have at least one instance of a boundary overlap during at least one time interval during a simulation.

In step 660, FEA system 100 associates a visual representation to the various values of $\text{Sum}(x,y)$ obtained in step 640. For example, FEA system 100 may associate a gradually darker shade of gray to increasing values, or ranges of values, of $\text{Sum}(x,y)$. An example of such an association is shown in FIG. 5 and the associated description above. Step 650 may be performed in addition to step 640. In step 650, the value of $\text{Sum}(x,y)$ for any particular coordinate obtained in step 640 is divided by the number of time increments over which the sum is performed. By dividing the sum for any coordinate by the number of time increments over which the sum is performed, a frequency of boundary 200 overlap is obtained for each coordinate $(x,y)$ for which a value of $\text{Sum}(x,y)$ is obtained. Step 660 may then associate a grayscale with such frequencies or ranges of frequencies in a manner similar to that described above for the values of $\text{Sum}(x,y)$. In yet another alternative embodiment, a color scale may be used instead of a grayscale. An output of the visual representation or representations obtained in step 660 may be output to a display or printed in step 670. Step 670 may be performed by output controller 110 connected to output device 112 such as a printer or display. Alternatively, the information obtained in step 660 may be stored to computer readable medium 104, or stored at a remote network storage location through network controller 114.

Figure 7:
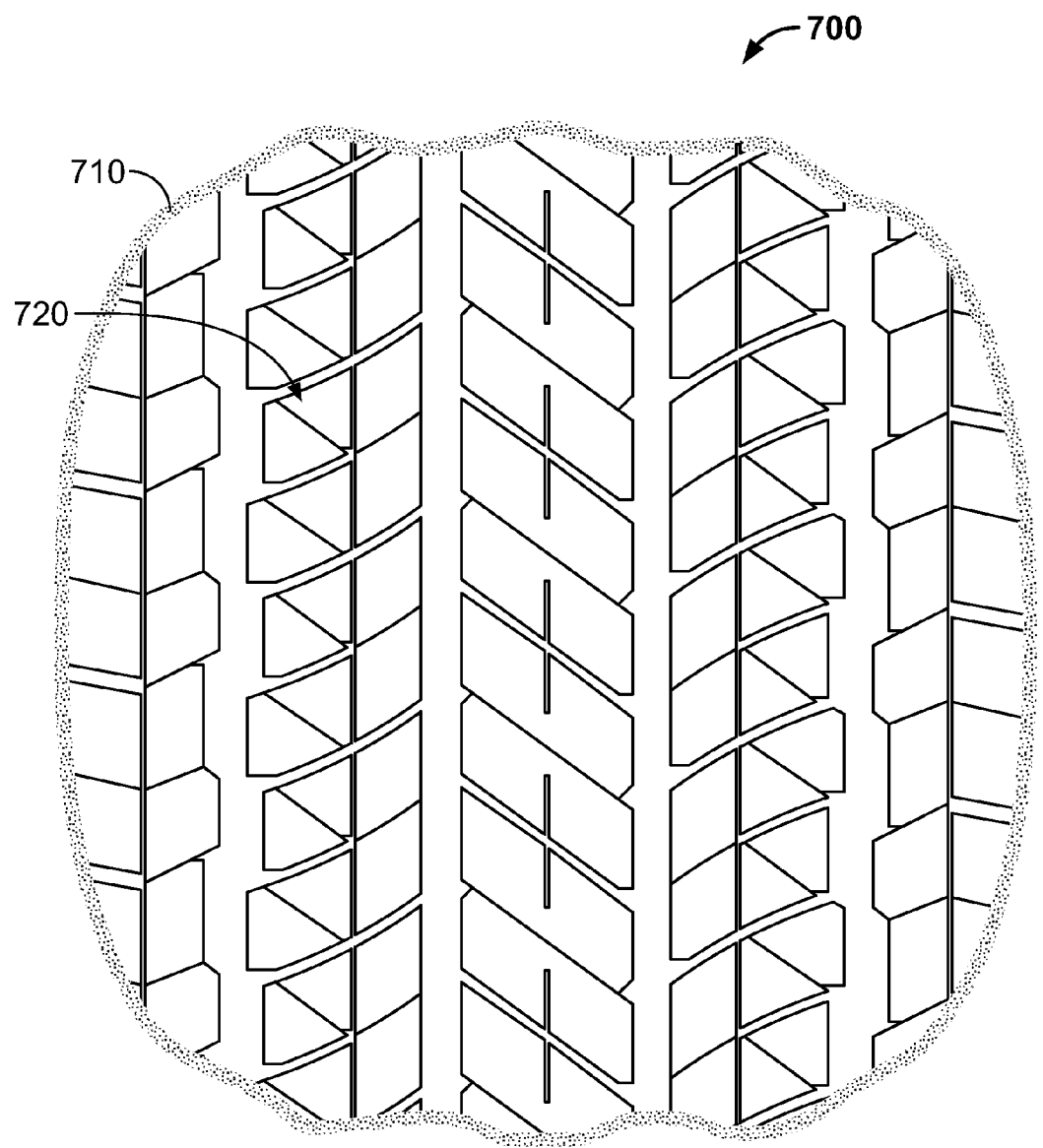
FIG. 7 illustrates an exemplary output of method 600 that may be produced by FEA system 100.

FIG. 7 illustrates an exemplary output plot 700 that may be produced by FEA system 100 performing method 600. The boundary 200 shown in FIG. 2 is replaced by a boundary distribution 710 representing the values of Sum(x,y) obtained by FEA system 100 executing a plurality of instructions for performing method 600. Boundary distribution plot 710 is overlayed on a portion of the tread of the modeled tire. Locations, or pixels on which boundary 200 has overlapped during an FEA simulation are represented by a suitable color or shade of gray selected, for example, in step 660 of method 600. Similarly to the plot shown in FIG. 5, darker shading represents higher values of Sum(x,y) or alternatively the frequency of overlap determined by dividing Sum(x,y) over the number of time increments over which Sum(x,y) is determined Lighter shading, or no shading, corresponds to lower values of Sum(x,y). In the illustrated output 700, tread 720 is shown. However, the illustrated boundary distribution plot 710 does not correspond to any particular placement of the tread 720 with respect to the simulated road surface, and in other embodiments may be omitted altogether. The illustrated boundary distribution plot 710 may be presented upon a user's input through user interface 106.

The information provided by FEA system 100 and the exemplary method 600 described herein allows a user to have a graphical representation of tire boundary behavior over the course of an FEA simulation. For example, a user may be able to visualize regions of a tire footprint 200 having undesirably large ranges of movement over the course of a simulation, which in turn may be indicative of premature tire wear, undesirable handling and poor noise characteristics. As a result, the user is able to change the tire model, and perform method 600 on the altered model in order to determine whether the characteristics of the modeled tire are improved. Such simulations and alterations to the tire model may be performed iteratively to determine an optimum tire design.

It will be appreciated that the exemplary embodiments described above and illustrated in the drawings represent a few of the many ways of implementing and applying finite element analysis to calculate boundary overlap sums and frequencies and obtain a boundary distribution plot. The present disclosure is not limited to the specific methods and systems disclosed herein, but may be applied to any field that uses finite element analysis to calculate boundary overlap sums and frequencies and boundary distribution plots. The methods described and illustrated in the present disclosure may be modified in any manner that accomplishes the functions described herein. It is to be understood that the methods and apparatuses described herein may be distributed in any manner among any quantity (e.g., one or more) of hardware and/or software modules or units, computer or processing systems or circuitry.

Software for implementing the methods disclosed herein may be integrated within a stand-alone computer system or may execute separately and be coupled to any number of devices, workstation computers, server computers or data storage devices via any communications medium (e.g., network, modem, direct connection, etc.). The processes described herein may be implemented by any quantity of devices and/or any quantity of personal or other type of devices, computers or processing system (e.g., Windows based PCs, Apple computers, UNIX workstations and servers, laptops, desktops, etc.). In addition, the processes described herein may be implemented by users stationed remotely from FEA system 100. For example, a user may interact with a user interface that communicates with an FEA system 100 at a remote location over a network connection. The FEA system 100 may include any commercially available operating system (e.g., Windows, Mac Lion, Unix, Linux, etc.), any commercially available and/or custom FEA software and any types of input and/or output devices (e.g., keyboard, mouse, displays, printers, etc.).

It is to be understood that the software having instructions for implementing the processes described herein may be implemented in any desired computer language, and could be developed by one of ordinary skill in the computer and/or programming arts based on the functional description contained herein. For example, in one exemplary embodiment, the processes disclosed herein can be written using the Python programming language, however, the present disclosure is not limited to being implemented in any specific programming language. The various instructions and data sets may be stored in any quantity or types of file, data or database structures. Moreover, the software for performing the steps described herein may be distributed on any suitable medium (e.g., stored on devices such as CD-ROM and diskette, downloaded from the Internet or other network (e.g., via packets and/or carrier signals), downloaded from a bulletin board (e.g., via carrier signals), or other conventional distribution mechanisms).

The software for implementing the methods described herein may be installed and executed on a computer system in any conventional or other manner (e.g., an install program, copying files, entering an execute command, etc.). The functions associated with an FEA system 100 that performs the steps described herein may be performed on any quantity of computers or other processing systems. Further, the specific functions may be assigned to one or more of the computer systems in any desired fashion.

Further, any references herein of software performing various functions generally refer to computer systems or processors performing those functions under software control. The computer system may alternatively be implemented by hardware or other processing circuitry. The various functions of the methods described herein may be distributed in any manner among any quantity (e.g., one or more) of hardware and/or software modules or units, computer or processing systems or circuitry, where the computer or processing systems may be disposed locally or remotely of each other and communicate via any suitable communications medium (e.g., LAN, WAN, Intranet, Internet, hardwire, modem connection, wireless, etc.). The software and/or processes described above and illustrated in the flow charts and diagrams may be modified in any manner that accomplishes the functions described herein.

For the purposes of this disclosure and unless otherwise specified, "a" or "an" means "one or more." To the extent that the term "includes" or "including" is used in the specification or the claims, it is intended to be inclusive in a manner similar to the term "comprising" as that term is interpreted when employed as a transitional word in a claim. Furthermore, to the extent that the term "or" is employed (e.g., A or B) it is intended to mean "A or B or both." When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995). Also, to the extent that the terms "in" or "into" are used in the specification or the claims, it is intended to additionally mean "on" or "onto." As used herein, "about" will be understood by persons of ordinary skill in the art and will vary to some extent depending upon the context in which it is used. If there are uses of the term which are not clear to persons of ordinary skill in the art, given the context in which it is used, "about" will mean up to plus or minus 10% of the particular term. From about A to B is intended to mean from about A to about B, where A and B are the specified values.

While the present disclosure illustrates various embodiments, and while these embodiments have been described in some detail, it is not the intention of the applicant to restrict or in any way limit the scope of the claimed invention to such detail. Additional advantages and modifications will be apparent to those skilled in the art. Therefore, the invention, in its broader aspects, is not limited to the specific details and illustrative examples shown and described. Accordingly, departures may be made from such details without departing from the spirit or scope of the applicant's claimed invention. Moreover, the foregoing embodiments are illustrative, and no single feature or element is essential to all possible combinations that may be claimed in this or a later application.

What is claimed is:

1. A method for modeling a distribution of a tire footprint boundary, comprising:
    inputting into a finite element analysis system a finite element model of a tire rolling against a road surface described by discrete road surface coordinates;
    performing a finite element analysis simulation of the model of the tire rolling against the road surface for a first plurality of time increments;
    generating a plurality of tire footprint boundary data, each of the tire footprint boundary data having road surface coordinates on which a footprint boundary overlaps corresponding to a unique one of a second plurality of time increments of the finite element analysis, wherein the second plurality of time increments is a subset of the first plurality of time increments;
    determining for each of a plurality of the discrete road surface coordinates a number of the second plurality of time increments during which the tire footprint boundary overlaps each of the plurality of the discrete road surface coordinates;
    generating a plot of the tire footprint boundary at points on the discrete road surface coordinates based on the number of the second plurality of time increments during which the footprint boundary overlaps each of the plurality of the discrete road surface coordinates; and
    adjusting the finite element model of the tire based on the generated plot.

2. The method of claim 1, wherein the generating the plot includes:
    associating a color scale or grayscale with the number of the second plurality of time increments during which the footprint boundary overlaps each of the plurality of the discrete road surface coordinates; and
    displaying the plurality of the discrete road surface coordinates in the associated color scale or grayscale.

3. The method of claim 2, wherein the adjusting the finite element model of the tire includes adjusting the finite element model of the tire based on the displayed plurality of the discrete road surface coordinates in the associated color scale or grayscale.

4. The method of claim 1, further comprising:
    obtaining for each of the plurality of the discrete road surface coordinates an overlap frequency by calculating the number of the second plurality of time increments during which the footprint boundary overlaps each of the plurality of the discrete road surface coordinates divided by a number of time increments in the second plurality of time increments.

5. The method of claim 1, wherein the second plurality of time increments of the finite element analysis are selected to occur while the finite element model of a tire rolls in a steady state.

6. The method of claim 1, wherein the coordinates on which the tire footprint boundary overlaps is determined at least in part by curve fitting coordinates obtained from the tire footprint boundary data.

7. The method of claim 1, wherein the finite element analysis includes use of a finite element analysis mesh with an average spacing that is not more than between about 2 to 20 times the average spacing of the discrete road surface coordinates.

8. A method for modeling a distribution of a tire footprint boundary, comprising:
    inputting into a finite element analysis system a finite element model of a tire rolling against a road surface, each location on the road surface corresponding to a discrete coordinate;
    performing a finite element analysis simulation of the model of the tire rolling against the road surface for a first plurality of time increments;
    generating a plurality of tire footprint boundary data, each of the tire footprint boundary data having coordinates on which a footprint boundary overlaps corresponding to a unique one of a second plurality of time increments of the finite element analysis, wherein the second plurality of time increments is a subset of the first plurality of time increments;
    determining for each of a plurality of the discrete coordinates of the road surface a boundary overlap value proportional to the number of the second plurality of time increments during which the footprint boundary overlaps each of the plurality of the discrete coordinates;
    generating a plot of the tire footprint boundary at points on the discrete coordinates of the road surface based on the number of the second plurality of time increments during which the footprint boundary overlaps each of the plurality of the discrete coordinates of the road surface; and
    adjusting the finite element model of the tire based on the generated plot.

9. The method of claim 8, wherein the generating the plot includes:
    associating a color scale or grayscale with the boundary overlap value of each of the plurality of the discrete coordinates; and
    displaying the plurality of the discrete coordinates in the associated color scale or grayscale.

10. The method of claim 9, wherein the adjusting the finite element model of the tire includes:
    adjusting the finite element model of the tire based on the displayed plurality of the discrete coordinates in the associated color scale or grayscale.

11. The method of claim 8, wherein the second plurality of time increments of the finite element are separated from adjacent time increments by a constant duration.

12. The method of claim 8, wherein the coordinates on which a footprint boundary overlaps is determined at least in part by curve fitting coordinates obtained from the tire footprint boundary data.

13. An apparatus for modeling a distribution of a tire footprint boundary, comprising:
    one or more computer readable media configured to accept a finite element model of a tire rolling against a road surface, each location on the road surface corresponding to a discrete coordinate, and at least one processor;
    first instructions written upon the one or more computer readable media that upon execution by the at least one processor perform a finite element analysis simulation of a model of a tire rolling against a road surface for a first plurality of time increments;

second instructions written upon the one or more computer readable media that upon execution by the at least one processor generate a plurality of tire footprint boundary data, each of the tire footprint boundary data having coordinates on which a footprint boundary overlaps corresponding to a unique one of a second plurality of time increments of the finite element analysis, wherein the second plurality of time increments is a subset of the first plurality of time increments;

third instructions written upon the one or more computer readable media that upon execution by the at least one processor determine for each of a plurality of the discrete coordinates of the road surface a number of the second plurality of time increments during which the footprint boundary overlaps each of the plurality of the discrete coordinates;

fourth instructions written upon the one or more computer readable media that upon execution by the at least one processor generate a plot of the tire footprint boundary at points on the discrete coordinates of the road surface based on the number of the second plurality of time increments during which the footprint boundary overlaps each of the plurality of the discrete coordinates of the road surface; and fifth instructions written upon the one or more computer readable media that upon execution by the at least one processor adjust the finite element model of the tire based on the generated plot.

14. The apparatus of claim 13, wherein the fourth instructions include:

instructions that upon execution by the at least one processor associate a color scale or grayscale with the number of the second plurality of time increments during which the footprint boundary overlaps each of the plurality of the discrete coordinates; and instructions that upon execution by the at least one processor display the plurality of the discrete coordinates in the associated color scale or grayscale.

15. The apparatus of claim 13, further comprising:

sixth instructions written upon the one or more computer readable media that upon execution by the at least one processor obtain for each of the plurality of the discrete coordinates an overlap frequency by calculating the number of the second plurality of time increments during which the footprint boundary overlaps each of the plurality of the discrete coordinates divided by a number of time increments in the second plurality of time increments.

* * * * *